(12) United States Patent
Kwon et al.

(10) Patent No.: US 12,144,215 B2
(45) Date of Patent: Nov. 12, 2024

(54) DISPLAY DEVICE AND METHOD FOR MANUFACTURING THE SAME

(71) Applicant: SAMSUNG DISPLAY CO., LTD., Yongin-si (KR)

(72) Inventors: Han Bum Kwon, Hwaseong-si (KR); Mun Sik Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 427 days.

(21) Appl. No.: 17/501,012

(22) Filed: Oct. 14, 2021

(65) Prior Publication Data

US 2022/0157916 A1 May 19, 2022

(30) Foreign Application Priority Data

Nov. 19, 2020 (KR) .................. 10-2020-0155604

(51) Int. Cl.
*H10K 59/131* (2023.01)
*H10K 59/12* (2023.01)
*H10K 71/00* (2023.01)

(52) U.S. Cl.
CPC ........... *H10K 59/131* (2023.02); *H10K 71/00* (2023.02); *H10K 59/1201* (2023.02)

(58) Field of Classification Search
CPC ...... H10K 59/131; H05K 1/147; H05K 1/028; H05K 1/118; H05K 1/189; H05K 2201/046; H05K 1/111; G09F 9/301
See application file for complete search history.

(56) References Cited

U.S. PATENT DOCUMENTS

| 7,299,547 | B2 | 11/2007 | Choi et al. |
| 10,032,805 | B2 | 7/2018 | Ye et al. |
| 2018/0138257 | A1* | 5/2018 | Higano ............... H10K 59/131 |
| 2019/0250447 | A1* | 8/2019 | Abe ...................... H05K 3/368 |
| 2021/0337672 | A1* | 10/2021 | Cheng .................. H05K 1/147 |
| 2022/0137447 | A1* | 5/2022 | Inoue ............... G02F 1/133528 |
| | | | 349/56 |

FOREIGN PATENT DOCUMENTS

| CN | 108877501 | 11/2018 |
| JP | 2002341369 | 11/2002 |

* cited by examiner

*Primary Examiner* — Moazzam Hossain

(74) *Attorney, Agent, or Firm* — F. Chau & Associates, LLC

(57) ABSTRACT

A display device and a method for manufacturing a display device are provided. An embodiment of a display device includes a display panel including a pad area including a plurality of pads, a first circuit board disposed to partially overlap the pad area; wherein the first circuit board includes: a first base board; a conductive layer disposed on the first base board and including a plurality of first bumps disposed on one end portion of the first base board, a plurality of second bumps disposed on the opposite end portion of the first base board, and a lead wiring connecting the first bump to the second bump, a passivation layer disposed on the first base board to cover the lead wiring; an adhesive layer disposed on the passivation layer to at least partially cover a top and side surface of one end portion of the display panel.

14 Claims, 16 Drawing Sheets

220: 221, 222, 223

DISPLAY DEVICE AND METHOD FOR MANUFACTURING THE SAME

CROSS-REFERENCE TO RELATED APPLICATION

This application claims priority under 35 U.S.C. § 119 to Korean Patent Application No. 10-2020-0155604 filed on Nov. 19, 2020 in the Korean Intellectual Property Office, the disclosure of which is incorporated by reference herein in its entirety.

TECHNICAL FIELD

The present disclosure relates to a display device and a method for manufacturing a display device.

DISCUSSION OF THE RELATED ART

Display devices have been used with electronic devices to deliver multimedia content to users. Various types of display devices such as a liquid crystal display (LCD) device, an organic light emitting display (OLED) device and the like have been used.

A typical display device may include a substrate partitioned into a display area and a non-display area. A plurality of pixels may be disposed on the substrate the display area, and a plurality of pads and the like may be disposed on the substrate in the non-display area. A flexible film having a driving circuit and the like may be coupled to the plurality of pads to transmit a driving signal to the pixels. In some conventional display devices, moisture may penetrate a region between the circuit and the plurality of pads, which may cause decreased reliability of the device. Additionally, some conventional display devices may have less integrated connections between the display panel and a circuit board, resulting in a large bezel.

SUMMARY

Aspects of the present disclosure provide a display device capable of preventing permeation of moisture into a bonding portion between a panel pad and a circuit board and having a reduced bezel size, and a method for manufacturing the display device.

An embodiment of a display device includes a display panel including a pad area including a plurality of pads; a first circuit board disposed to partially overlap the pad area; wherein the first circuit board includes: a first base board; a conductive layer disposed on the first base board and including a plurality of first bumps disposed on one end portion of the first base board, a plurality of second bumps disposed on the opposite end portion of the first base board, and a lead wiring connecting the first bump to the second bump; a passivation layer disposed on the first base board to cover the lead wiring; and an adhesive layer disposed on the passivation layer to at least partially cover a top surface and side surface of one end portion of the display panel.

An embodiment of a method for manufacturing a display device includes preparing a display panel and a first circuit board including an adhesive layer disposed on one surface thereof; attaching the first circuit board to one end portion of the display panel; and bending the first circuit board to bring the adhesive layer into contact with one side surface of the display panel.

The reliability of a display device according to one embodiment can be improved, by preventing permeation of moisture into the bonding portion between the panel pad and the circuit board by an adhesive layer. Further since the circuit board is directly attached to a side surface of a panel via the adhesive layer, the bezel size of the display device can be decreased, and cracks that may occur in the circuit board can be prevented.

In accordance with the method for manufacturing the display device according to one embodiment, it is possible to prevent permeation of moisture into the bonding portion between the panel pad and the circuit board by attaching the circuit board that includes the adhesive layer to the panel. Further, it is possible to manufacture the display device, which has a small bezel size and is capable of preventing a crack that may occur in the circuit board, by attaching the circuit board to the side surface of the panel via the adhesive layer.

It should be noted that the effects of the present disclosure are not necessarily limited to those described above, and other effects of the present disclosure will be apparent from the following description.

BRIEF DESCRIPTION OF THE DRAWINGS

The above and other aspects and features of the present, disclosure will become more apparent by describing in detail exemplary embodiments thereof with reference to the attached drawings, in which.

DETAILED DESCRIPTION OF THE EMBODIMENTS

The present inventive concepts will now be described more fully hereinafter with reference to the accompanying drawings, in which embodiments of the inventive concepts are shown. The inventive concepts may, however, be embodied in different forms and should not necessarily be construed as limited to the embodiments set forth herein. Rather, these embodiments are provided so that this disclosure will be thorough and complete, and will filly convey the scope of the inventive concepts to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device illustrated in the figures is turned over, elements described as "below" or "beneath" other elements of features may then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

In the present description, "when viewed on a plane" or "in a plan view" may be defined as being viewed from or as so viewed from a vertical (ex, "Z") direction.

The same reference numbers may indicate the same components throughout the specification. Description of singular elements may be applied to a plurality of those same elements, unless otherwise indicated by context.

Hereinafter, embodiments will be described in detail with reference to the accompanying drawings.

Figure 1:
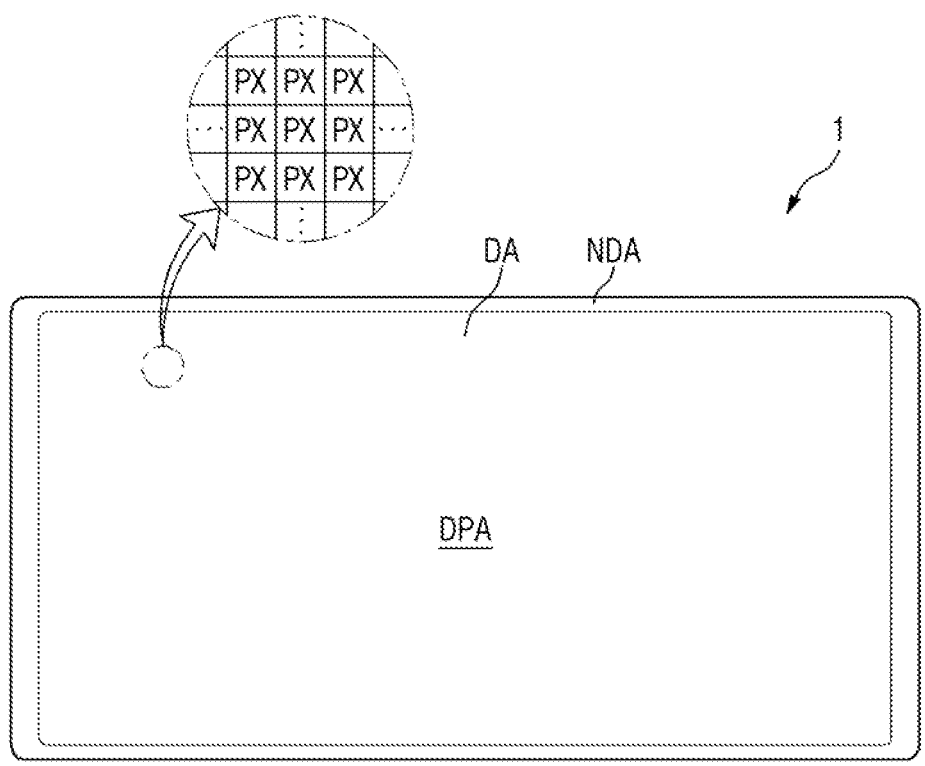
FIG. 1 is a perspective view of a display device according to one embodiment.

FIG. 1 is a perspective view of a display device according to one embodiment.

Referring to FIG. 1, a display device 1 is a device configured to display a moving image or a still image. The display device 1 may be used as a display screen for various products such as televisions, laptop computers, monitors, billboards, and the Internet of Things, as well as for portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

Figure 2:
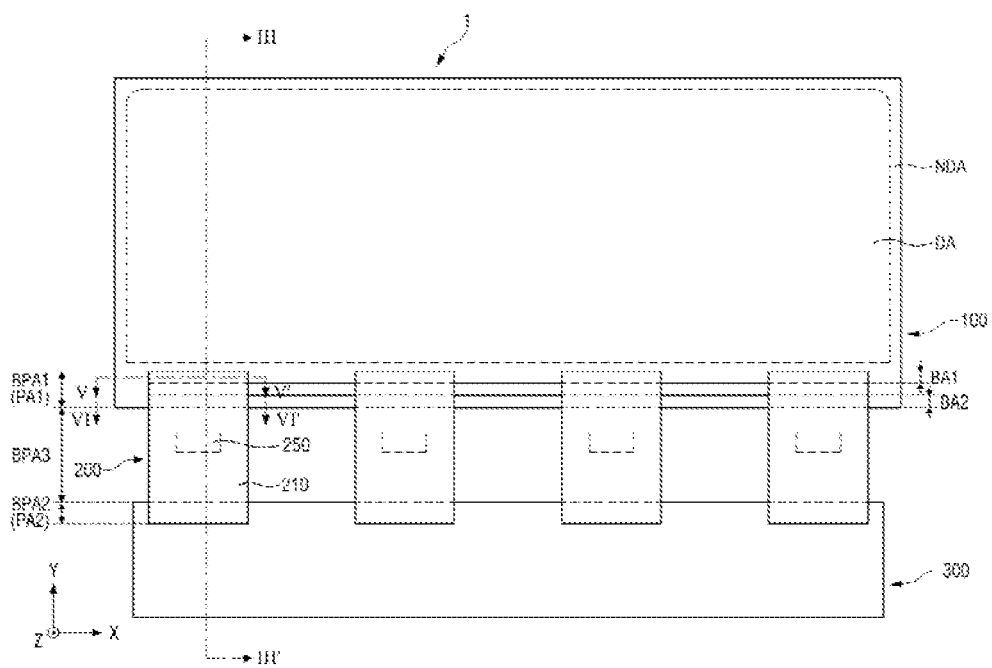
FIG. 2 is a plan view of a display device according to one embodiment.
Figure 3:
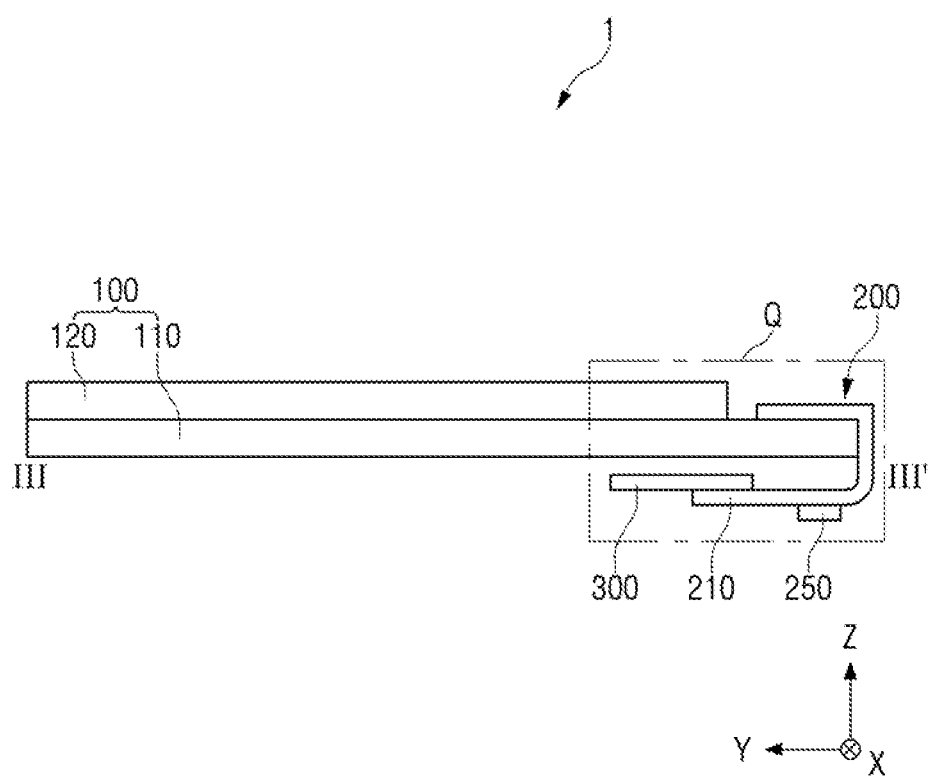
FIG. 3 is a cross-sectional view taken along line of FIG. 2.
Figure 4:
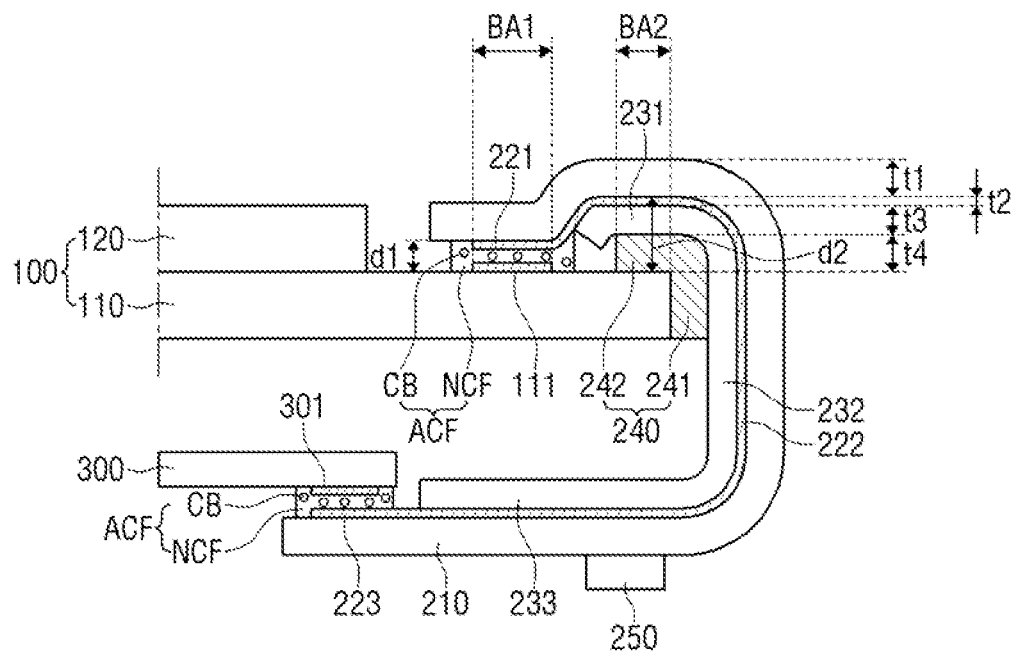
FIG. 4 is an enlarged view of area Q of FIG. 3.
Figure 5:
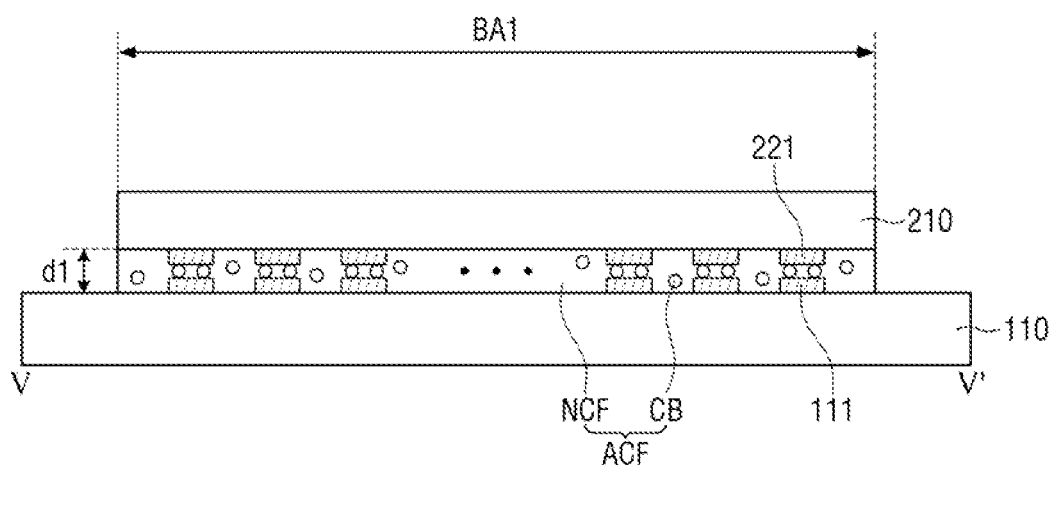
FIG. 5 is a cross-sectional view taken along fine V-V' of FIG. 2.
Figure 6:
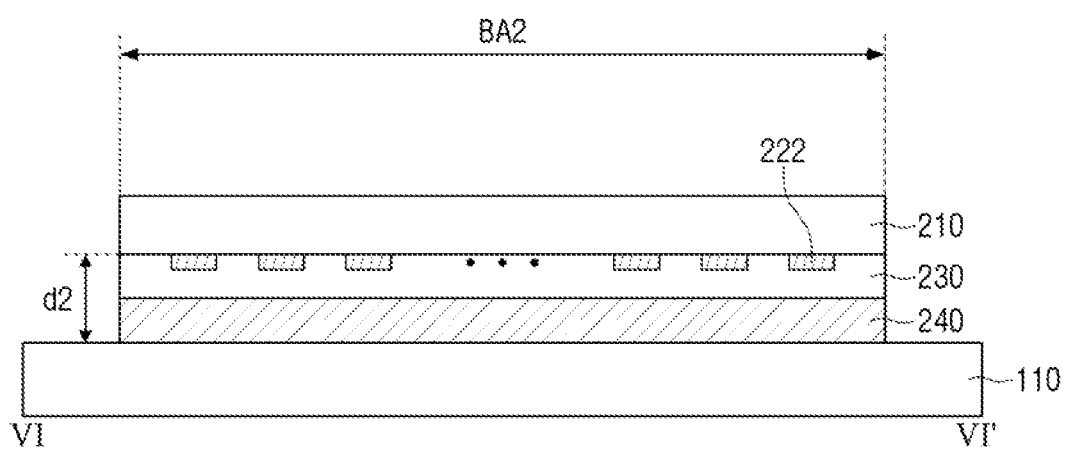
FIG. 6 is a cross-sectional view taken along line VI-VI' of FIG. 2.
Figure 6:
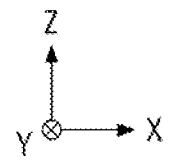

FIG. 2 is a plan view of a display device according to one embodiment FIG. 3 is a cross-sectional view taken along line of FIG. 2. FIG. 4 is an enlarged view of area Q of FIG. 3. FIG. 5 is a cross-sectional view taken along line V-V' of FIG. 2. FIG. 6 is a cross-sectional view taken along line VI-VI' of FIG. 2.

Referring to FIGS. 2 to 6, in FIG. 2, the display device 1 may include a display area DA configured to display an image and a non-display area NDA disposed around the display area DA. The display area DA may have a rectangular shape with right-angled or rounded corners in plan view. The planar shape of the display area DA is not necessarily limited to a rectangular shape, however, and may have a circular shape, an elliptical shape, or various other shapes.

The non-display area NDA may be disposed around the display area DA. The non-display area NDA may be disposed adjacent to one or more edges of the display area DA in a first direction X. The non-display area NDA may also be disposed adjacent to one or more edges of the display area DA in a second direction Y. For example, the non-display area NDA may surround all lateral sides of the display area DA.

The display device 1 may include a display panel 100 configured to display an image, a first circuit board 200 attached to an end of the display panel 100 in the second direction Y, and a second circuit board 300 attached to an end of the first circuit board 200 in the second direction Y.

The display panel 100 may be, for example, an organic light emitting display panel.. In the following embodiments, a case where an organic light emitting display panel is applied to the display panel 100 will be described, but the present disclosure is not necessarily limited thereto, and other types of display panels such as a liquid crystal display panel, a quantum nano light emitting display panel, a micro LED display panel, a field emission display panel, an electrophoretic display panel, and the like may be applied.

The display panel 100 may include at plurality of pixels disposed in the display area DA. The display panel 100 may further include a first pad area PA1 disposed in the non-display area NDA. The first pad area PA1 may extend in the first direction X. The first pad area PAL may be located at one side of the display area DA in the non-display area NDA. For example, as shown in FIG. 2, the first pad area PA1 may be disposed adjacent to one side of the display area DA in the second direction Y. A width of the non-display area NDA where the first pad area PA1 is disposed may be greater than a width of the non-display area NDA where the first pad area PA1 is not disposed.

As shown in FIG. 2, the width of the first pad area PA1 in the first direction X may be the same as the width of the remaining area of the display panel 100 in the first direction X that excludes the first pad area PA1, but the widths are not necessarily limited thereto. The width of the first pad area PA1 in the first direction X may be less than the width of the remaining area of the display panel 100 in the first direction X that excludes the first pad area PA1. The display panel 100 may further include a corner portion whose width in the first direction X decreases from the display area DA to the non display area NDA where the first pad area PA1 is disposed.

For example, the distance between edges of the first circuit boards 200 along the first pad area PA1 and edges the display panel 100 in the first direction X may be the same. However, the present disclosure is not necessarily limited thereto, and the distance between edges of the first circuit boards 200 along the first pad area PA1 of the display panel 100 in the first direction X may be less than the distance between an edge of the first circuit board 200 and of the remaining area of the display panel 100 in the first direction X excluding the first pad area PA . In FIG, 3, the display panel 100 may include a first substrate 110 and a second substrate 120 disposed on the first substrate 110.

The first substrate 110 may include a plurality of pixels and light emitting elements disposed for the respective pixels. The first substrate 110 may be a display substrate that provides light required for image display.

The second substrate 120 may face the first substrate 110. For example, the second substrate 120 may be an encapsulation substrate disposed on the first substrate 110 to seal the light emitting element. The second substrate 120 may prevent damage to the light emitting element from air, moisture, or the like. The second substrate 120 may include a transparent plate or a transparent film. For example, the second substrate 120 may include a material such as glass, quartz, and the like.

The first substrate 110 may have a larger area than that of the second substrate 120. For example, the first substrate 110 may be larger than the second substrate when viewed on a plane. A partial area of the first substrate 110 on one side in the second direction Y may not overlap the second substrate 120. The first pad area PA1 may be disposed in the partial area of the first substrate 110 on one side in the second direction Y, which does not overlap the second substrate 120.

The display panel 100 may further include a sealing member that bonds the first substrate 110 to the second substrate 120.

The first pad area PA1 may be disposed in an area of the first substrate 110 which does not overlap the second substrate 120. The first pad area PA1 may include a plurality of first pads 111 arranged along one direction. For example, the plurality of first pads 111 may be arranged in the first pad area PA along the first direction X, but is not necessarily limited thereto. Further, the first pads 111 may be arranged in one row in the first pad area PA1, but are not necessarily limited thereto, and may be arranged in a plurality of rows.

Each of the first pads 111 may be connected to a wiring extending from the display area DA. Further, each of the first pads 111 may be electrically connected to the first circuit board 200 which will be described later. The first pad 111 may include one or more of copper (Cu), tin (So), gold (Au), or nickel (Ni), and may be formed as a single layer or a multilayer.

A plurality of first circuit boards 200 may be attached to the first pad area PA1 of the display panel 100. The plurality of first circuit boards 200 may be arranged in the first pad area PA1 of the display panel 100 along the first direction X. One end portion of each first circuit board 200 in the second direction Y may be attached to the first pad area PA1 of the display panel 100.

The first circuit board 200 may include a first bump area BPA1 located on one side in the second direction Y and overlapping the first pad area PA1, a second bump area BPA2 located on the other side in the second direction Y and overlapping a second pad area PA2 which will be described later, and a third bump area BPA3 located between the first bump area BPA1 and the second bump area BPA2.

The first bump area BPA1 may be disposed in one end portion of the first circuit board 200. A plurality of first bumps 221 may be disposed in the first bump area PA1. The first bumps 221 may be arranged in one row in one direction. For example, the first bumps 221 may be arranged side by side in the first direction X. In FIG. 4, the first bumps 221 are shown arranged in one row, but they are not necessarily limited thereto, and may be arranged in multiple rows.

In FIG. 4, the first bumps 221 of the first circuit board 200 may be respectively bonded to the first pads 111 of the display panel 100 to be electrically connected thereto. In one embodiment, the first bump 221 and the first pad 111 may be bonded to each other via an anisotropic conductive film ACE disposed therebetween. The anisotropic conductive film ACF may include an adhesive film NCF and a conductive ball CB interposed in the adhesive film NCF. The first bump 221 and the first pad 111 may be bonded to each other via the adhesive film NCF, and may be electrically connected to each other through the conductive ball CB. Bonding using the anisotropic conductive film ACF may be achieved by a thermo-compression bonding method. In another embodiment, the first bump 221 of the first circuit board 200 may be directly bonded to the first pad 111 without another layer or another component interposed therebetween. Such direct bonding may be performed by ultrasonic bonding, but is not necessarily limited thereto.

Each first bump 221 may have a smaller size than that of each first pad 111, but is not necessarily limited thereto, and may have the same or greater size than that of each first pad 111.

The material of the first bumps 221 is not necessarily limited as long as it is easily bonded to the first pad 111. The first bumps 221 may be formed of, for example, one or more of cold (Au), nickel (Ni), and tin (Sn). The plurality of first bumps 221 may have a single layer structure or a stacked structure made of the above materials.

The area where the first pad 111 and the first bump 221 overlap each other may be defined as a first bonding area BA1. The distance between the first circuit board 200 and the first substrate 110 may be defined as a distance between the top surface of the first substrate 110 and a bottom surface of a base circuit board 210 of the first circuit board 200. The distance between the first circuit board 200 and the first substrate 110 in the first bonding area BA1 is represented as a first distance d1 in FIG. 4. In the first bonding area BA1, the anisotropic conductive film ACF may be disposed between the base circuit board 210 and the first substrate 110.

The second bump area BPA2 may be disposed in the other end portion of the first circuit board 200. A plurality of second bumps 223 may be disposed in the second bump area BPA2. The plurality of second bumps 223 may be arranged in one row in one direction. For example, the plurality of second bumps 223 may be arranged. side by side in the first direction X. Although illustrated in FIG. 7 to be described later that the second bumps 223 are arranged in one row, the present disclosure is not necessarily limited thereto and the second bumps 223 may be arranged multiple rows spaced apart from each other in the second direction Y. The size of the second bump 223 may be greater than the size of the first bump 221. Further, the number of the second bumps 223 may be, but not necessarily, fewer than the number of the first bumps 221.

The third bump area BPA3 may be disposed between the first bump area BPA1 and the second bump area BPA2. A plurality of third bumps, which are electrically connected to a driving chip 250, may be disposed in the third bump area BPA3. A passivation layer 230 and an adhesive layer 240 which will be described later may be disposed in the third bump area BPA3.

The first circuit board 200 may be bent in the third direction Z with a curvature in the third bump area BPA3. The third bump area BPA3 may be bent with a constant radius of curvature. However, the present disclosure is not necessarily limited thereto, and the third bump area BPA3 may be bent with a different radius of curvature for each section. The top and bottom surfaces of the first circuit board 200 may be reversed as the first circuit board 200 is bent in the third bump area BPA3. For example, the first bump area BPA1 of the first circuit board 200 may face one side in the third direction Z, the third bump area BPA3 may face one side in the second direction Y, and the second bump area BPA2 may face the other side in the third direction Z.

The second bump area BPA2 may extend from the third bump area BPA3. The second bump area BPA2 may extend from a point where bending is completed in a direction parallel to the first bump area BPA1. The second bump area BPA2 may overlap the first bump area BPA1 in the thickness direction (ex., a Z direction) of the first circuit board 200. The second bump area BPA2 may overlap the non-display area NDA of the display panel 100 that overlaps the first bump area BPA1.

Hereinafter, a detailed structure of the first circuit board 200 will be described.

Figure 7:
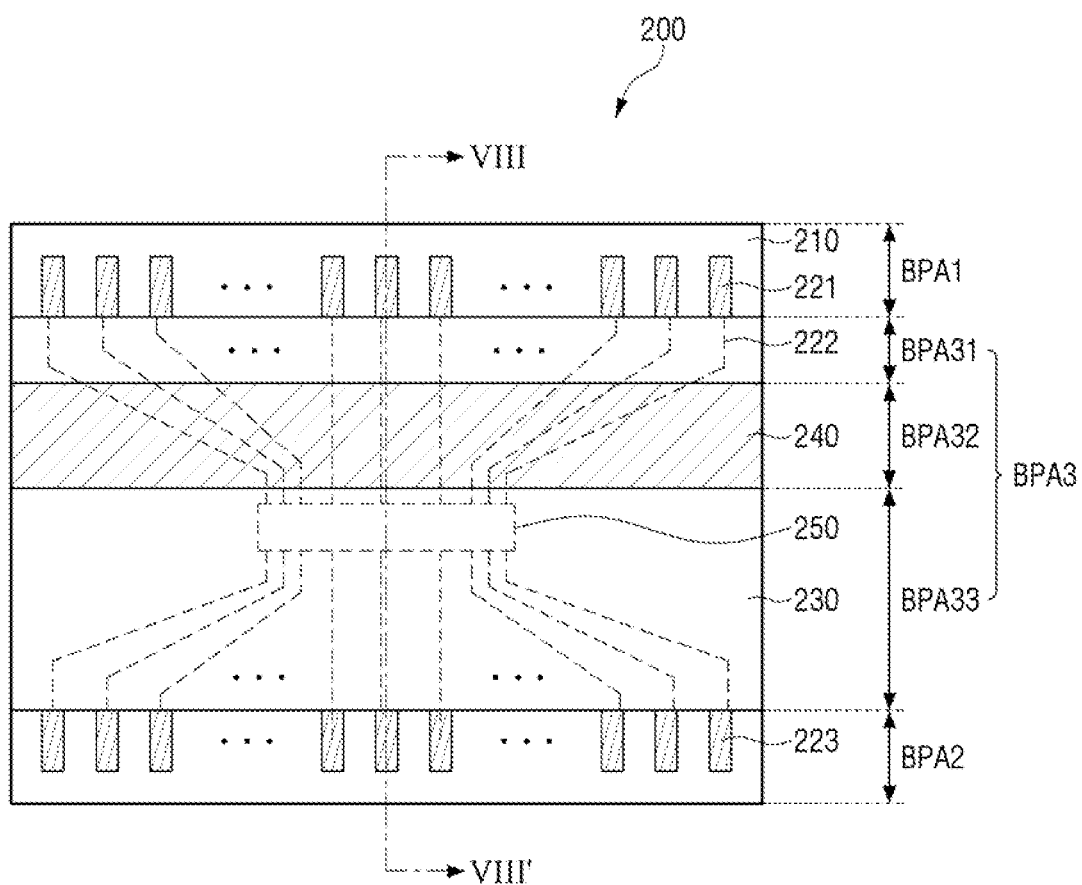
FIG. 7 is a rear plan view of a first circuit board according to one embodiment.
Figure 8:
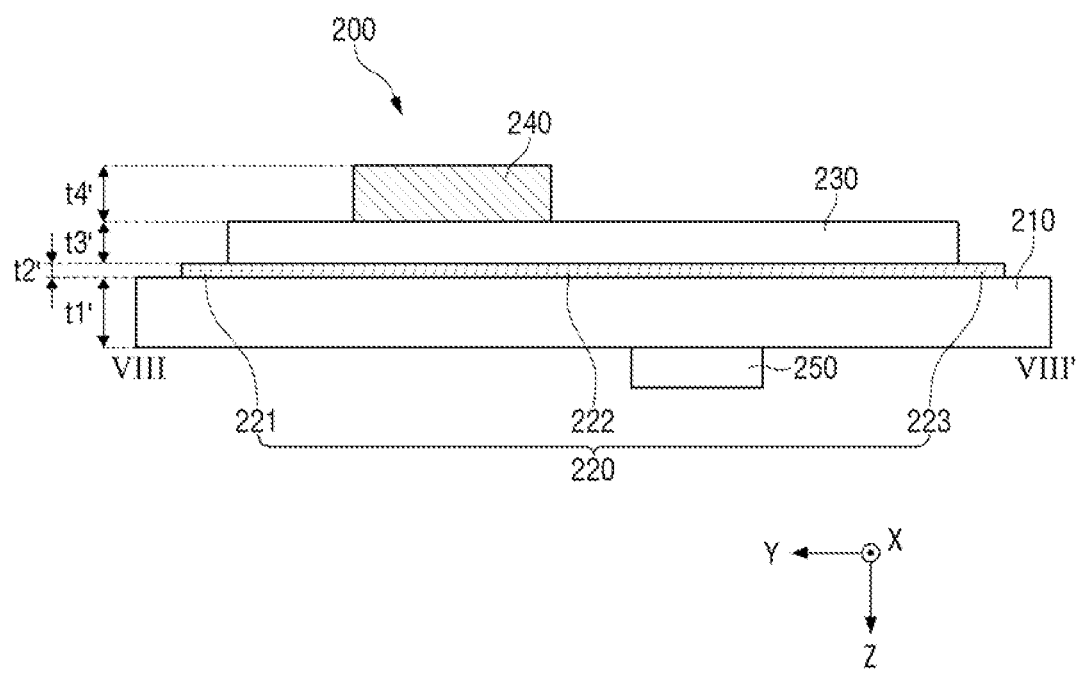
FIG. 8 is a cross-sectional view taken along fine VIII-VIII' of FIG. 7.

FIG. 7 is a rear plan view of a first circuit board according to one embodiment. FIG. 8 is a cross-sectional view taken along line IP of FIG. 7.

Referring to FIGS. 7 and 8 in conjunction with FIGS. 2 to 6, the first circuit board 200 may include the base circuit board 210, a conductive layer 220 disposed on one surface of the base circuit board 210, the passivation layer 230 disposed above the one surface of the base circuit board 210 while partially covering the conductive layer 220, the adhesive layer 240 disposed on the passivation layer 230, and the driving chip 250 disposed on the other surface of the base circuit board 210.

A data driving integrated circuit used to drive the display device 1 may be included in the driving chip 250 and attached. to a plastic substrate or a glass substrate in a chip on film (COF) method.

The base circuit board 210 may be a flexible substrate including a flexible material. The base circuit board 210 may be disposed to substantially surround an end portion of the first substrate 110 in the second direction Y. The base circuit board 210 may include at least one of polyethylene terephthalate (PET), polyimide (PI), polycarbonate (PC), polyethylene (PE), polypropylene (PP), polysulfone (PSF), polymethylmethacrylate (PMMA), triacetylcellulose (TAC) or cycloolefin polymer (COP).

In FIG. 7, the conductive layer 220 may be disposed on one surface of the base circuit board 210. The conductive layer 220 of the first circuit board 200 may include the plurality of first bumps 221 disposed on one side in the second direction Y, the plurality of second bumps 223 disposed an the other side in the second direction Y, and a plurality of lead wirings 222 that electrically connect the first bumps 221 to the second bumps 223. A. diameter of the lead wiring 222 may be smaller than the width of each of the first and second bumps 221 and 223. The conductive layer 220 may be formed of, for example, one or more of gold (Au), nickel (Ni), and tin (Sn). The conductive layer 220 may have a single layer structure or a stacked structure made of the above materials.

The plurality of lead wirings 222 may be electrically connected to the driving chip 250 which will be described later. The first bump 221, the second bump 223, and the lead wiring 222 may be respectively disposed in the first, second and third bump areas BPA1, BPA2, and BPA3. The first and second bumps 221 and 223 might not overlap the passivation layer 230 which will be described later, and the lead wiring 222 may overlap the passivation layer 230. However, the present disclosure is not necessarily limited thereto, and the lead wiring 92 may partially overlap the passivation layer 230.

The passivation layer 230 partially covering the conductive layer 220 may be disposed above one surface of the base circuit board 210. The passivation layer 230 may be disposed in the third bump area BPA3. The passivation layer 230 may prevent oxidation of the conductive layer 220 and protect the conductive layer 220 from external impacts. The passivation layer 230 may partially cover the conductive layer 220 while exposing partial areas thereof. The areas of the conductive layer 220 that are exposed without being covered by the passivation layer 230 may include the first bump 221 and the second bump 223. The passivation layer 230 may cover the entire lead wirings 222 of the conductive layer 220, but is not necessarily limited thereto, and may cover only a part of the lead wirings 222. The passivation layer 230 may surround an end portion of the first substrate 110 in the second direction Y.

In the example of FIG. 4. in which the first circuit board 200 is attached onto the first substrate 110, the passivation layer 230 may include a first sub-passivation portion 231 disposed above an end portion of the first substrate 110 in the second direction Y, a second sub-passivation portion 232 that extends from the first sub-passivation portion 231 and is disposed past an end of last substrate 110 in the second direction Y, and a third sub-passivation portion 233 that extends from the second sub-passivation portion 232 and is disposed beneath an end of the first substrate 110 in the third direction Z. The first sub-passivation portion 231 may be disposed between the lead wiring 222 and a second sub-adhesive portion 242 which will be described later. The second sub-passivation portion 232 may be bent at one side oldie first sub-passivation portion 231 in the second direction Y and may extend downward in the third direction Z. A first sub-adhesive portion 241 which will be described later may be disposed between the second sub-passivation portion 232 and an end portion oldie first substrate 110 in the second direction Y. The third sub-passivation portion 233 may be bent at a terminal side of the second sub-passivation portion 232 in the third direction Z and may extend in the second direction Y. The third sub-passivation portion 233 may be spaced apart from the first substrate 110 in the third direction Z. The second circuit bond 300 may be disposed at one side of the third sigh passivation portion 233, and may extend in the second direction Y.

The passivation layer 230 may include, for example, at least one of a melamine resin, an epoxy resin, an epoxy-imidazole resin, or an imidazole compound, but is not necessarily limited thereto.

The adhesive layer 240 may be disposed on the passivation layer 230. The adhesive layer 240 may be disposed in a partial region of the third bump area BPA3 where the passivation layer 230 is disposed. The third bump area BPA3 may include an adhesive layer area BPA32 in which the passivation layer 230 and the adhesive layer 240 overlap each other, a first passivation layer exposure area BPA31 that is adjacent to the first bump area BPA1 and does not overlap the adhesive layer 240, to expose the passivation layer 230, and a second passivation layer exposure area BPA33 that is adjacent to the second bump area BPA2 and does not overlap the adhesive layer 240, to further expose the passivation layer 230.

The adhesive layer area BPA32 may be disposed between the first and second passivation layer exposure areas BPA31 and BPA33. The first passivation layer exposure area BPA31 may be, disposed between the first bump area BPA1 and the adhesive layer area BPA32. The second passivation layer exposure area BPA33 may be disposed between the second bump area BPA2 and the adhesive layer area BPA32. A difference in thickness of the first circuit board 200 between the first bonding area BA1 and a second bonding area BA2 may be reduced by the first passivation layer exposure area BPA3. For example, without the first passivation layer exposure area BPA31, the first circuit board 200 which includes the passivation layer 230 and the base circuit board 210 may be overly thick such that there might exist a pressure that pushes up on the first circuit board 200 near the first bonding area BA1. Accordingly, the first circuit board 200 may be stably attached to the first substrate 110, and prevented from being peeled off from the first substrate 110.

The adhesive layer 240 has adhesive properties, and may attach the first circuit board 200 to the first substrate 110. The adhesive layer 240 may attach the first circuit board 200 to the first substrate 110 in the entire area the adhesive layer 240 contacts the first substrate 110, but the present disclosure is not necessarily limited thereto. For example, the adhesive layer 240 may attach the first circuit board 200 to the first substrate 110 in a partial area in which the adhesive layer 240 contacts the first substrate 110. Further, since the passivation layer 230 has moisture resistance properties, to the presence of the adhesive layer 240 in conjunction with the passivation layer 230 may prevent permeation of moisture into the first bonding area BA1.

In the example of FIG. 4, in which the first circuit board 200 is attached onto the first substrate 110, the adhesive layer 240 may be disposed partially cover the top surface of an other end portion of the first substrate 110 M the second direction Y, and may cover a side surface thereof in the second direction Y. The adhesive layer 240 may partially overlap the lead wiring 222 of the conductive layer 220 in the second and third directions (ex., in the Y and Z directions). The adhesive layer 240 may substantially in the first direction X. For example, the adhesive layer 240 may have a shape extending in the same direction as the first pad area PA1. The length of the adhesive layer 240 in the first direction X may be, but not necessarily, the same as the length of the base circuit board 210 in the first direction X.

The adhesive layer 240 may cover an end portion of the first substrate 110 in the second direction Y. The adhesive layer 240 may include the first sub-adhesive portion 241 that is in contact with a side surface of the first substrate 110 in the second direction Y and the second sub-adhesive portion 242 that extends from the first sub-adhesive portion 241 and is in contact with the top surface of an end portion of the first substrate 110 in the second direction Y.

The first sub-adhesive portion 241 may be disposed between the second sub-passivation portion 232 and a side surface of the first substrate 110 in the second direction Y. The first circuit board 200 may be in close contact with an end portion of the first substrate 110 in the second direction Y via the first sub-adhesive portion 241. For example, the sub-adhesive portion 241 may effectively hold the first circuit board 200 closer to the first substrate 210. Accordingly, the bezel of the display device 1 according to one embodiment can be effectively decreased.

The area of the adhesive layer 240 overlapping, the base circuit board 210 may be smaller than the area of a surface of the passivation layer 230 overlapping the base circuit board 210, but is not necessarily limited thereto, and may be the same as or greater than that of the passivation layer 230. For example, the adhesion between the adhesive layer 240 and. the passivation layer 230 may be greater than the adhesion between the adhesive layer 240 and the first substrate 110, but the present disclosure is not necessarily limited thereto.

The second sub-adhesive portion 242 may be disposed between the first sub-passivation portion 231 and the top surface of an end portion of the first substrate 110 in the second direction Y. The second sub-adhesive portion 242 may be attached to the first sub-passivation portion 231, and may further be attached to the top surface of an end portion of the first substrate 110 in the second direction Y. The adhesion between the second sub-adhesive portion 242 and the first sub-passivation portion 231 may be greater than the adhesion between the second sub-adhesive portion 242 and the top surface of an end portion of the first substrate 110 in the second direction Y. The adhesive layer 240 may include a thermosetting resin with adhesive and moisture resistance properties. For example, the adhesive layer 240 may include at least one of a non-conductive film (NCF) or an epoxy resin, but is not necessarily limited thereto.

Referring to FIGS. 4 and 6, the area where the adhesive layer 240 and the top surface of the first substrate 110 overlap each other may be defined as the second bonding area BA2. As described above, the distance between the first circuit board 200 and the first substrate 110 may be defined as the distance between the top surface of the first substrate 110 and the bottom surface of the base circuit board 210 of the first circuit board 200. The distance between the first circuit board 200 and the first substrate 110 in the second bonding area BA2 is represented as a second distance d2 in FIG. 4. The second distance d2 may be greater than the first distance d1, where the first distance d1 is the distance between the first circuit board 200 and the first substrate 110 in the first bonding area BA1. However, the present disclosure is not necessarily limited thereto, and the second distance d2 may be equal to or smaller than the first distance d1.

When comparing the thicknesses of the respective components included in the first circuit board 200 with reference to FIG. 8, the base circuit board 210, the conductive layer 220, the passivation layer 230, and the adhesive layer 240 may have a first thickness a second thickness t2', a third thickness t3', and a fourth thickness t4', respectively. In the first to fourth thicknesses t to t4', the first thickness t1' may be the largest, followed by the fourth thickness t4', the third thickness t3', and the second thickness t2' in decreasing order, but the present disclosure is not necessarily limited thereto. For example, the first thickness t1' may be about 35 μm to 40 μm, the second thickness t2' may be about 5 μm to 10 μm, the third thickness t3' may be about 8 μm to 12 μm, and the fourth thickness t4 may be about 10 μm to 20 μm, but the present disclosure is not necessarily limited thereto.

In the example of FIG. 4, in which the first circuit board 200 is attached onto the first substrate 110 in the second bonding area BA2, the base circuit board 210, the conductive layer 220, the passivation layer 230, and the adhesive layer 240 may have a first thickness t1, a second thickness t2, a third thickness t3, and a fourth thickness t4, respectively. The relative sizes and numerical values of the first to fourth thicknesses t1 to t4 may be the same as the relative sizes and numerical values of the first to fourth thicknesses t1' to t4' described above.

The first circuit board 200 may include the driving chip 250 disposed on one surface of the base circuit board 210. For example, the driving chip 250 may be disposed on the surface opposite to the surface of the base circuit board 210 on v the conductive layer 220, the passivation layer 230, and the adhesive layer 240 are disposed. In one embodiment, the driving chip 250 may be disposed in the center of the first circuit board 200. The driving chip 250 may be configured to receive an image signal applied from the second circuit board 300 to be described later, converting it to a data signal in the form of an analog voltage, and transmitting the data signal to a pixel. The driving chip 250 may overlap the passivation layer 230, but may not overlap the adhesive layer 240. However, the present disclosure is not necessarily limited thereto.

In FIGS. 2 to 4, the second circuit board 300 may be attached to an end portion of the first circuit board 200. Although FIG. 2 illustrates one second circuit board 300 attached to end portions of the plurality of first circuit boards 200, the number of the second circuit boards 300 is not necessarily limited thereto. The second circuit board 300 may include a plurality of second pads 301 that are respectively and. electrically connected to the plurality of second bumps 223 of the first circuit board 200. As a driving controller, the second circuit board 300 may generate a gate control signal, a data control signal, and image data using an image signal and a plurality of timing signals inputted from an external system, and provide the gate control signal, the data control signal, and the image data to the driving chip 250 of the first circuit board 200.

The second circuit board 300 may be a rigid substrate including a material such as glass or quartz, but is not necessarily limited thereto, and the second circuit board 300 may be a flexible substrate including a flexible material. For example, the second circuit board 300 may include at least one of polyethylene terephthalate (PET), polyimide (PI), polycarbonate polyethylene (PE), polypropylene (PP), polysulfone (PSF), polymethylmethacrylate (PMMA), triacetylcellulose (TAC) or cycloolefin polymer (COP).

In FIG. 2, the second pad area PA2 may be disposed in one end portion of the second circuit board 300. The plurality of second pads 301 may be disposed in the second pad area PA2. The plurality of second pads 301 may be arranged in one row in one direction. For example, the plurality of second pads 301 may be arranged along the first direction X. The present disclosure is not necessarily limited thereto, and the second pads 301 may form multiple rows. The second pad 301 may be made of any one of copper (Cu), tin (Sn), gold (Au), and nickel (Ni), and may be formed as a single layer or a multilayer.

The second pads 301 may be electrically connected to the second bumps 223 disposed in the second bump area BPA2 described above. Each second bump 223 may have a smaller size than that of each second pad 301, but is not necessarily limited thereto, and may have the same or larger size than that of each second pad 301.

The material of the second bumps 223 is not necessarily limited as long as it is easily bonded to the second pad 301, but the second bumps 223 may be formed of, for example, one or more of gold (Au), nickel (Ni), and tin (Sn). The plurality of second bumps 223 may have a single layer structure or a stacked structure made of the above materials.

Each second bump 223 may be bonded and electrically connected to each second pad 301 of the second circuit board 300. The second bump 223 and the second pad 301 may be bonded to each other by an anisotropic conductive film ACF disposed therebetween. The present disclosure is not necessarily limited thereto, and the second bump 223 may be directly bonded to the second pad 301 of the second circuit board 300 without another layer or another component interposed therebetween. Such direct bonding may be performed by ultrasonic bonding.

In the display device 1 according to one embodiment, the adhesive layer 240 can prevent permeation of moisture into the first bonding area BA1, and improve the adhesion between the first substrate 110 and the first circuit board 200. In addition, since the adhesive layer 240 is attached to a side surface of the first substrate 110 in the second direction Y, it is possible to decrease the bezel of the display device 1 and prevent a crack that may occur in the first circuit board 200.

Figure 9:
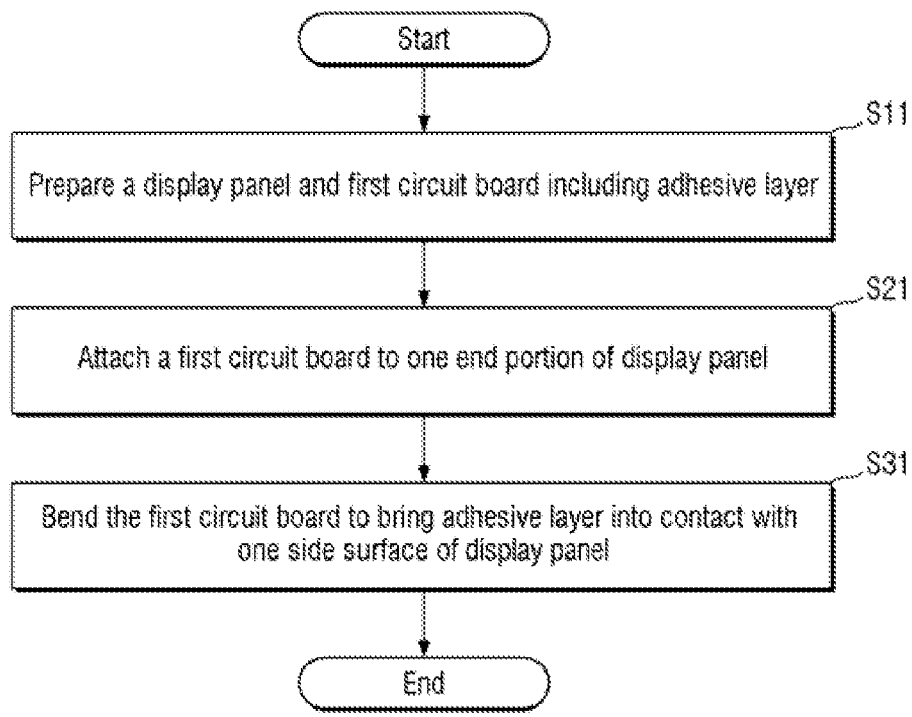
FIG. 9 is a flowchart of a method for manufacturing a display device according to one embodiment.

FIG. 9 is a flowchart illustrating a method for manufacturing a display device according to one embodiment. FIGS. 10 to 13 are schematic views illustrating a method for manufacturing a display device according to one embodiment.

Referring to FIGS. 9 to 13, a method for manufacturing a display device according to one embodiment may include preparing a display panel and a first circuit board including an adhesive layer (step S11), attaching the first circuit board to one end portion of the display panel (step S21), and bending the first circuit board to bring the adhesive layer into contact with one side surface of the display panel (step S31).

In step S11 of preparing the display panel and the first circuit board including the adhesive layer, the display panel and the first circuit board may be the same as the display panel 100 and the first circuit board 200 described above with reference to FIGS. 2 to 8. The first circuit board 200 may include the base circuit board 210, the conductive layer 220 disposed on one surface of the base circuit board 210, the passivation layer 230 disposed above the one surface of the base circuit board 210 while partially covering the conductive layer 220, the adhesive layer 240 disposed on the passivation layer 230, and the driving chip 250 disposed on the other surface of the base circuit board 210. To the extent any description is omitted, it may be assumed that the components (such as the display panel 100 and the first circuit board 200) are at least similar to those described above.

Figure 10:
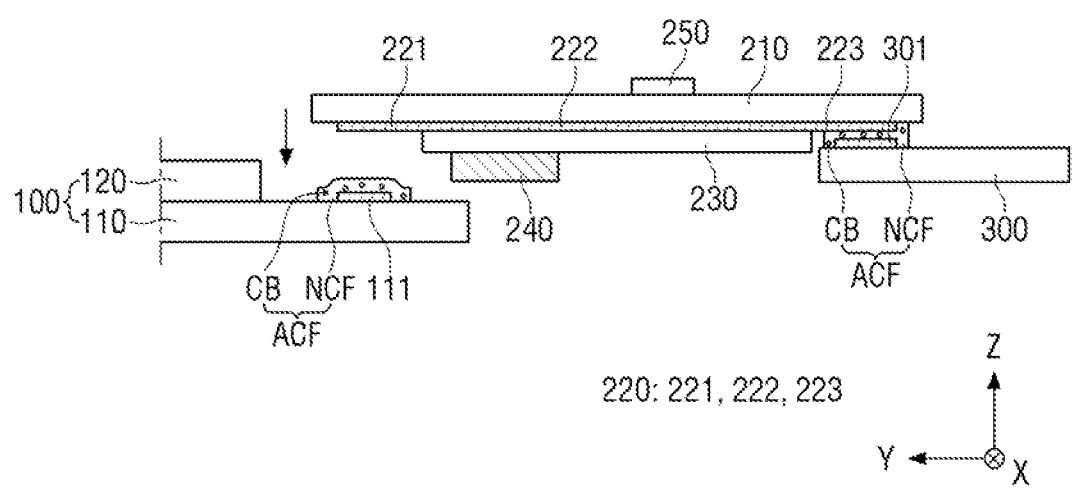
FIGS. 10 to 13 are schematic views illustrating a method for manufacturing a display device according to one embodiment.
Figure 11:
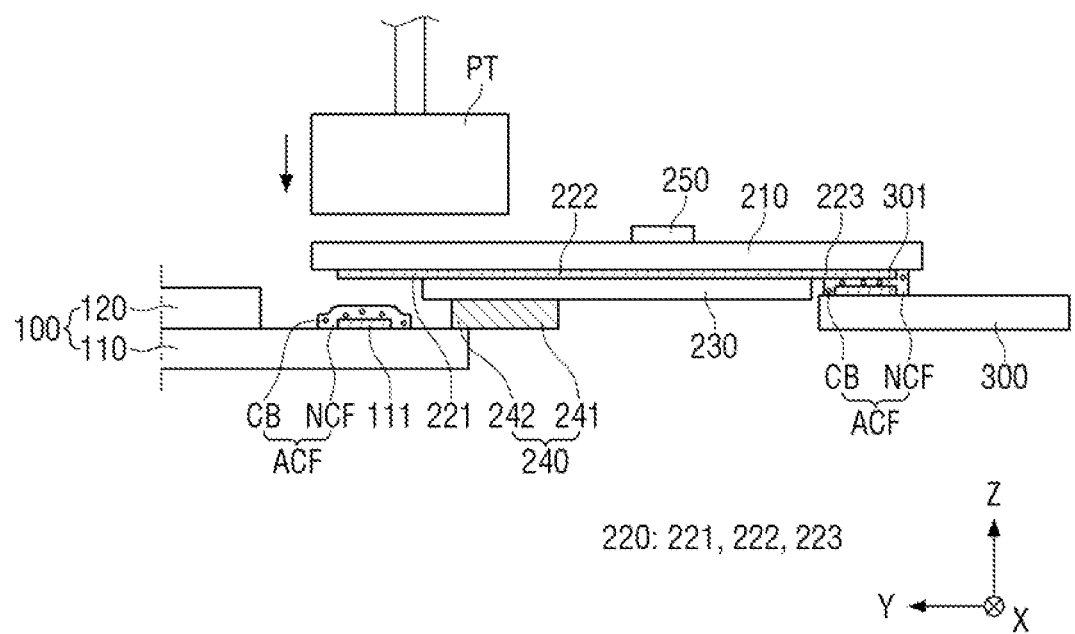

Referring to FIGS. 10 and 11, after step S11 of preparing the display panel and the first circuit board including the adhesive layer, step S21 of attaching the first circuit board 200 to the one end portion of the display panel may be performed.

Although FIGS. 10 and 11 illustrate that the second circuit board 300 is first attached to an end portion of the first circuit board 200 in the second direction Y and then the first circuit board 200 is attached to the display panel 100, the present disclosure is not necessarily limited thereto. For example, second circuit board 300 may be attached to the first circuit board 200 after the first circuit board 200 is attached to the display panel 100.

The anisotropic conductive film ACF may be applied on the first pad 111 of the first substrate 110. However, the present disclosure is not necessarily limited thereto, and the anisotropic conductive film ACF may also be applied to the first bump 221 of the first circuit board 200.

Step S21 of attaching the first circuit board to the one end portion of the display panel may include arranging the first circuit board 200 such that the first bump 221 is aligned above the first pad 111 of the first substrate 110 in the third direction Z. The fact that the first bump 221 is aligned above the first pad 111 of the first substrate 110 in the third direction Z may mean that the first bump 221 of the first circuit board 200 is located above the first pad 111 of the first substrate 110, and may overlap the first pad 111 in a thickness direction. In this case, the passivation layer 230 and the adhesive layer 240 of the first circuit board 200 may partially overlap the first substrate 110.

Step S21 of attaching the first circuit board to the one end portion of the display panel may further include mounting one end portion of the first circuit board 200 in the second direction Y on an end portion of the first substrate 110 in the second direction Y by moving the first circuit board 200 toward the other side in the third direction Z, after the step of arranging the first circuit board 200 to align the first bump 221 and the first pad 111 in the third direction Z. In this case, the second sub-adhesive portion 242 may be disposed on an end portion of the first substrate 110 in the second direction Y.

Step S21 of attaching the first circuit board to the one end portion of the display panel may further include a step of thermo-compressing the first circuit board 200 to the display panel 100 using a bonding tool PT after the step of mounting the one end portion of the first circuit board 200 in the second direction Y on an end portion of the first substrate 110 in the second direction Y. The bonding tool PT may be a thermo-compression bonding device that provides heat and pressure, in this step, the bonding tool PT may apply heat and pressure in the third direction Z. When compressed by the bonding tool PT, the first bump 221 may be attached to the first pad 111 via the anisotropic conductive film ACF. Specifically, the adhesive film NCF of the anisotropic conductive film ACF may attach the first bump 221 to the first pad 111, and the conductive ball CB of the anisotropic conductive film ACF may electrically connect the first bump 221 to the first pad 111.

When the first circuit board 200 is attached to the first substrate 110, the first and second bonding areas BA1 and BA2 described above with reference to FIG. 4 may be formed.

Figure 12:
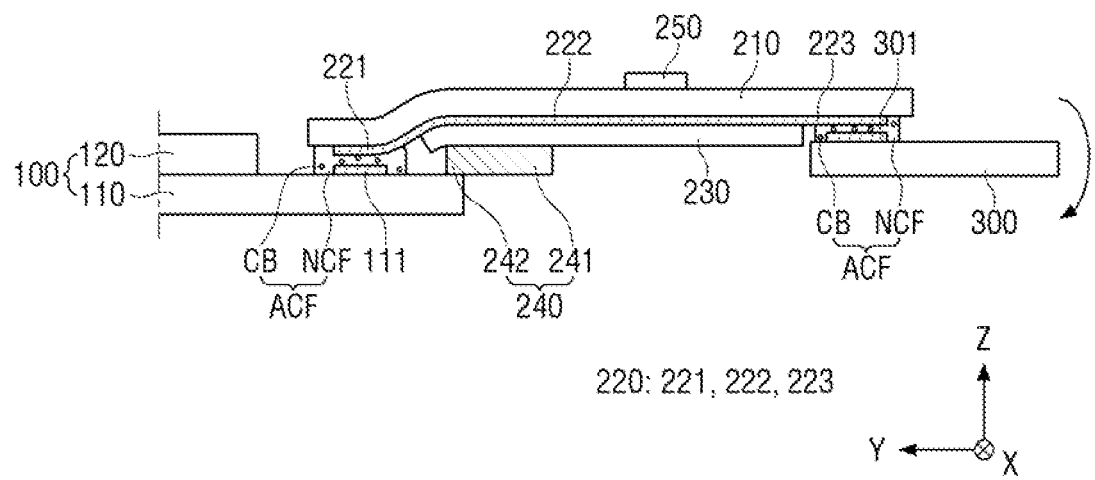
Figure 13:
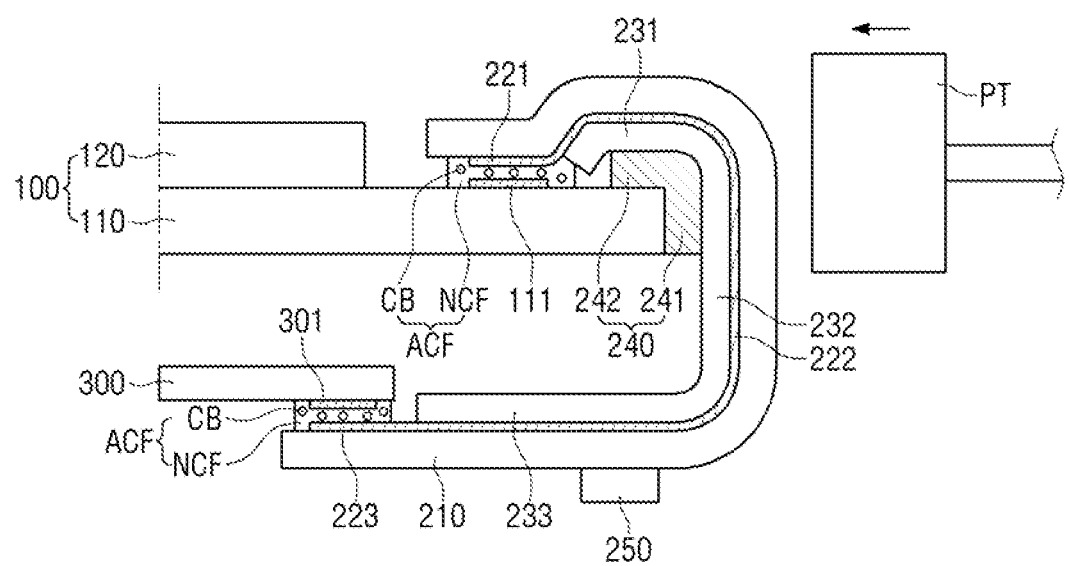

Referring to FIGS. 12 and 13, step S31 of bending the first circuit board to bring the adhesive layer into contact with the one side surface of the display panel may be performed after step S21 of attaching the first circuit board to the one end portion of the display panel.

Step S31 of bending the first circuit board to bring the adhesive layer into contact with the one side surface of the display panel may include bending the first circuit board 200 such that the first sub-adhesive portion 241 is in contact with a side surface of the first substrate 110 in the second direction Y. Specifically, when the one end portion of the first circuit board 200 in the second direction Y has been attached to an end portion of the display panel 100 in the second direction Y, the first sub-adhesive portion 241 of the adhesive layer 240 may be brought into in contact with a side surface of the first substrate 110 in the second direction Y by bending the first circuit board 200. The first circuit board 200 may be bent such that the second bump 223, the third sub-passivation portion 233, the driving chip 250, and the second circuit board 300 are arranged under the first substrate 110 while overlapping it, but the present disclosure is not necessarily limited thereto.

Referring to FIG. 13, step S31 of bending the first circuit board to bring the adhesive layer into contact with the one side surface of the display panel may further include thermo-compressing the first circuit board 200 to a side surface of the display panel 100 in the second direction Y using the bonding tool PT. Specifically, the bent first circuit board 200 may be thermo-compressed from a side surface of the first circuit board 200 in the second direction Y toward one side in the second direction Y using the bonding tool PT. In this step, the bonding tool PT may apply heat and pressure toward. the one side in the second direction Y. At this time, the first sub-adhesive portion 241 may attach the first circuit board 200 to the first substrate 110 on a side surface of the first substrate 110 in the second direction Y. In the previous step, as the bonding, tool PT had applied heat and pressure toward the other side in the third direction Z, this step may further include rotating the bonding tool PT by 90 degrees. However, the configuration of the bonding tool PT is not necessarily limited thereto, and the bonding tool PT that applied heat and pressure toward the other side in the third direction Z in the previous step and the bonding tool PT that applies heat and pressure toward one side in the second direction Y in this step may be separate bonding tools PT.

In accordance with the method for manufacturing a display device according to one embodiment, using the adhesive layer 240 can improve adhesion between the first substrate 110 and the first circuit board 200, and attach the first circuit board 200 to a side surface of the first substrate 110 in the second direction Y, thereby decreasing the bezel of the display device 1, and preventing a crack that may occur in the first circuit board 200. In addition, the adhesive layer 240 has moisture resistance, and by being disposed entirely in the first circuit board 200 in the first direction X, it may thereby effectively prevent permeation of moisture into the first bonding area BA1.

Hereinafter, another embodiment of the display device 1 will be described. In the following embodiments, a description of the same components as those of the above-described embodiment may be omitted or simplified., and differences will be mainly described.

Figure 14:
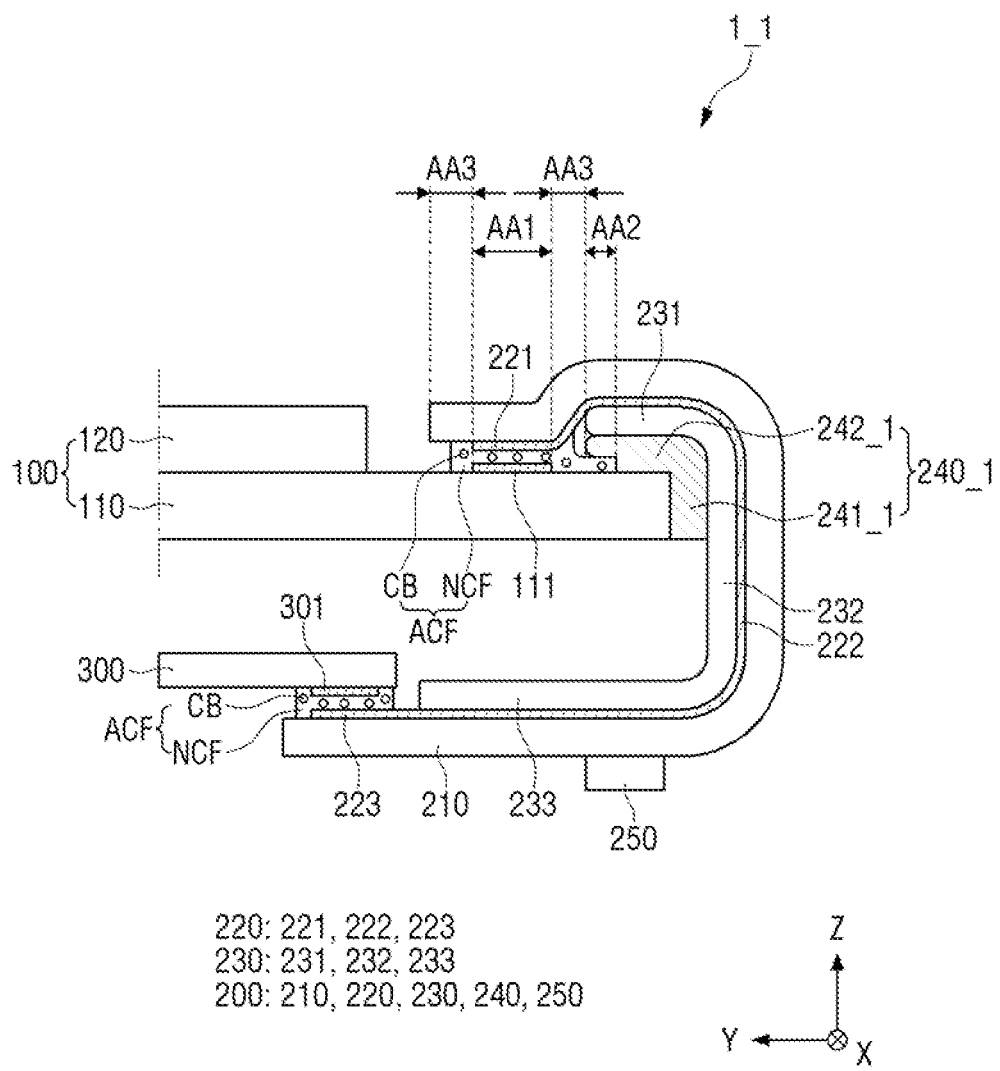
FIG. 14 is a cross-sectional view of a display device according to another embodiment.

FIG. 14 is a cross-sectional view of a display device according to another embodiment.

A display device 1_1 according, to the present embodiment is different from the display device 1 according to one embodiment in that the an isotropic conductive film ACF and an adhesive layer 240_1 are disposed partially overlapping each other between the first substrate 110 and the first circuit board 200. Since the contact area between the anisotropic conductive film ACF and the adhesive layer 240_1, which are the adhesive members, and the first substrate 110 and the first circuit board 200, which are the targets to be adhered, increases, the adhesion between the first substrate 110 and the first circuit board 200 may be increased.

The anisotropic conductive film ACF included in the display device 1_1 according to the present embodiment may include a first region AA1 that overlaps the first bump 221 and the first pad 111, a second region AA2 that overlaps the adhesive layer 240_1, and a third region AA3 that does not overlap all of the first bump 221, the first pad 111, and the adhesive layer 240_1. The first region AA1 may have an island structure, and may be disposed while being surrounded by the third region AA3. The second region AA2 may extend in the first direction X, and may be located on the other side of the third region AA in the second direction Y. In the second region AA2, the anisotropic conductive film ACF may be disposed between the adhesive layer 240_1 and the first substrate 110.

As described above, the anisotropic conductive film ACF may include the conductive ball CB. The number (hereinafter, referred to as "density of the conductive balls CB") of the conductive balls CB per unit volume in the first to third areas AA1, AA2, and AA3 may be different for each area. The density of the conductive balls CB in the first region AA1 may be greater than the density of the conductive balls CB in the third region AA3, and the density of the conductive balls CB in the second region AA2 may be greater than the density of the conductive balls CB in the third region AA3. Meanwhile, the density of the conductive balls CB in the first region AA1 may be greater than the density of the conductive balls CB in the second region AA2, but the present disclosure is not necessarily limited thereto. The density of the conductive balls CB in the second region AA2 may be the same as or greater than the density of the conductive balls CB in the first region AA1.

In the display device 1_1 according to the present embodiment, using the adhesive layer 240_1 can prevent permeation of moisture into the first bonding area BA1, and improve the adhesion between the first substrate 110 and the first circuit board 200. Further, since the adhesive layer 240_1 is attached to a side surface of the first substrate 110 in the second direction Y, the bezel of the display device 1_1 can be decreased.

Furthermore, in the display device 1_1 according to the present embodiment, the anisotropic conductive film ACE and the adhesive layer 240_1, which are the adhesive members for attaching the first circuit board 200 to the display panel 100, may overlap each other so that the adhesion between the display panel 100 and the first circuit board 200 can be improved.

Figure 15:
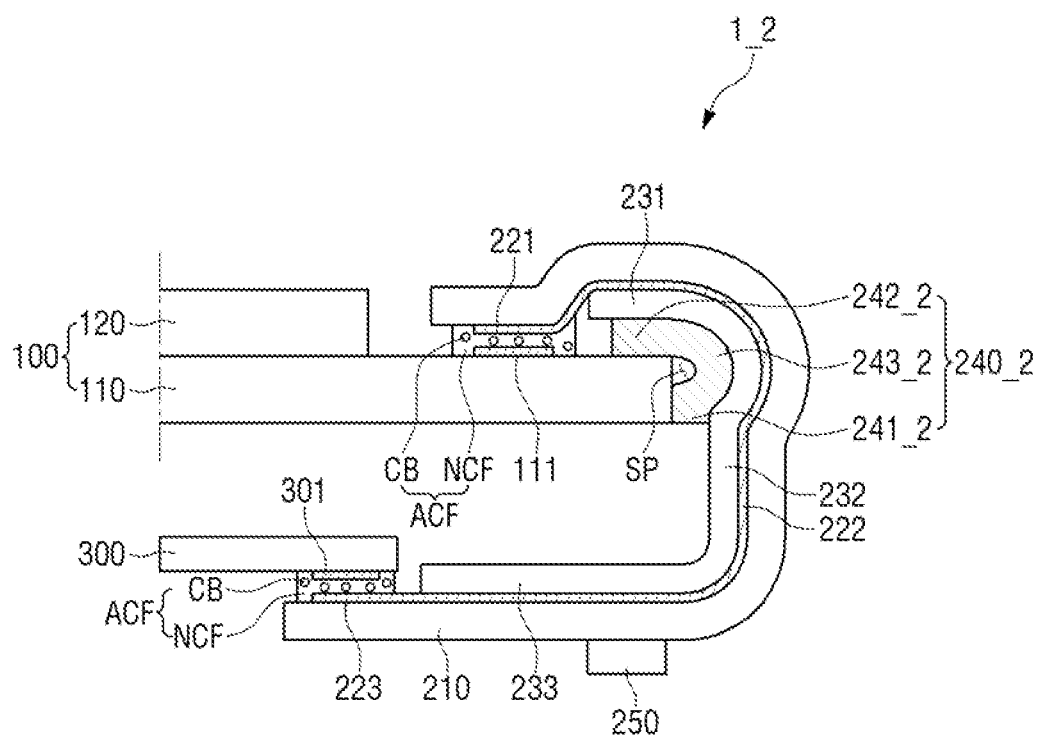
FIG. 15 is a partial cross-sectional view of a display device according to still another embodiment.

FIG. 15 is a partial cross-sectional view of a display device according to still another embodiment.

A display device 1_2 according to the present embodiment is different from the display device 1 according to one embodiment in that it includes a separation space SP formed between an adhesive layer 240_2 and the first substrate 110. The adhesive layer 240_2 of the display device 1_2 according to the present embodiment may surround the top and side surfaces of an end portion of the first substrate 110 in the second direction Y. Specifically, the adhesive layer 240_2 may include a first sub-adhesive portion 241_2 that overlaps a side surface of the first substrate 110 in the second direction Y, a second sub-adhesive portion 242_*-2 that overlaps the top surface of an end portion of the first substrate 110 in the second direction Y, and a third sub-adhesive portion 243_2 disposed between the fast and second sub-adhesive portions 241_2 and 242_2. The third sub adhesive portion 243_2 may be spaced apart from a side surface of the fast substrate 110 in the second direction Y. Meanwhile, the first sub-adhesive portion 241_2 may be in direct contact with a side surface of the first substrate 110 in the second direction Y, and the second sub-adhesive portion 242_2 may be in direct contact with the top surface of an end portion of the first substrate 110 in the second direction Y.

The separation space SP may be formed between the third sub-adhesive portion 243_2 and an end portion of the first substrate 110 in the second direction Y. The separation space SP may extend longwise along the first direction X. Each of the base circuit board 210, the lead wiring 222, the second sub-passivation portion 232, and the third sub-adhesive portion 243_2 may have a smoothly curved surface due to the separation space SP. For example, a part of the first circuit board 200 adjacent to the separation space SP may include a smoothly curved surface. Accordingly, since the first circuit board 200 is attached to the first substrate 110 with the separation space SP therebetween, stress applied to the first circuit board 200 can be reduced by the smoothly curved surface.

In the display device 1_2 according to the present embodiment, using the adhesive layer 2402 can prevent permeation of moisture into the first bonding area BA1, and improve the adhesion between the first substrate 110 and the first circuit board 200. Further, since the adhesive layer 2402 is attached to a side surface of the first substrate 110 in the second direction Y, the bezel of the display device 1_2 can be decreased.

In addition, in the display device 1_2 according to the present embodiment, the first circuit board 200 is attached while forming the separation space SP, thereby reducing stress applied to the first circuit board 200.

Figure 16:
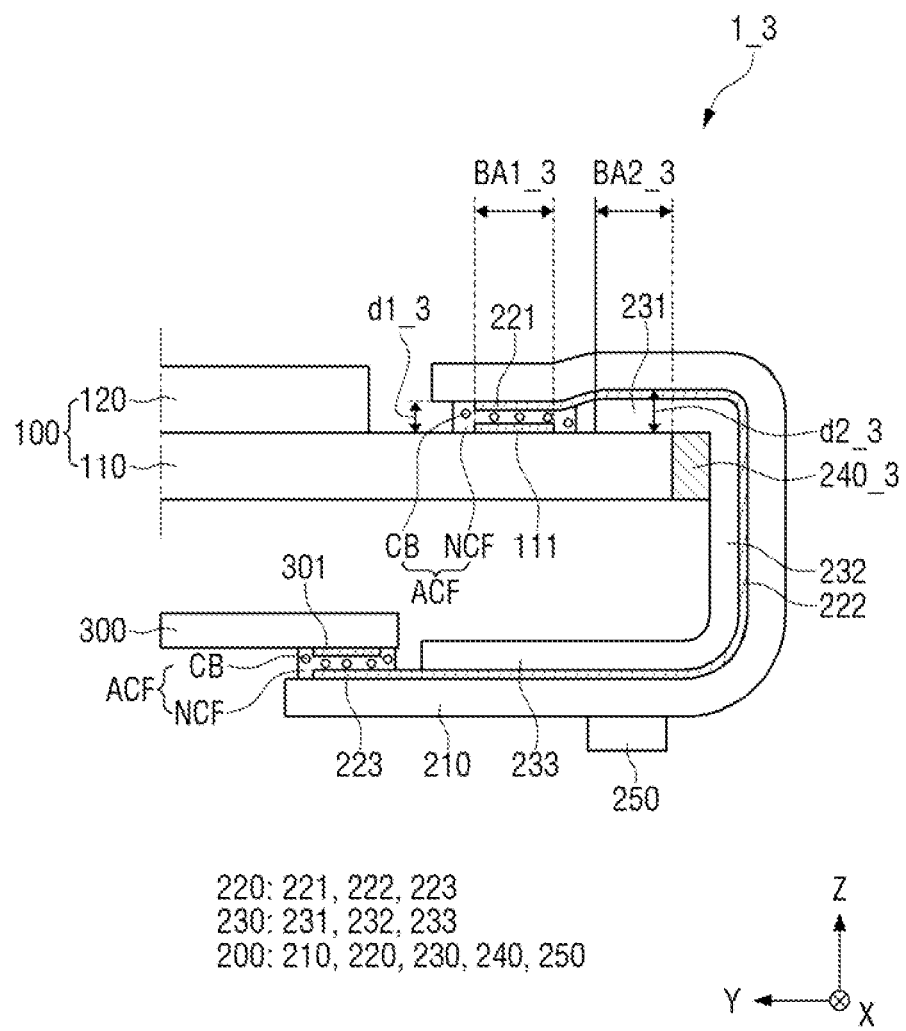
FIG. 16 is a partial cross-sectional view of a display device according to still another embodiment.

FIG. 16 is a partial cross-sectional view of a display device according to still another embodiment.

Referring to FIG. 16, a display device 1_3 according to the present embodiment is different from the display device 1 according to one embodiment in that an adhesive layer 240_3 is not disposed on the top surface of the first substrate 110, but is substantially disposed on a side surface thereof in the second direction Y.

The adhesive layer 240_3 of the display device according to the present embodiment may be disposed on a side surface of the first substrate 110 in the second direction Y without being disposed on the top surface of the first substrate 110.

In the display device 1_3 according to the present embodiment, the area where the first bump 221 and the first pad 111 overlap each other may be defined as a first bonding area BA1_3. The area where the top surface of the first substrate 110 is in contact with the first sub-passivation portion 231 may be defined as a second bonding area BA2_3. In the first bonding area BA1_3, the distance between the base circuit board 210 and the first substrate 110 may defined as a first distance d1_3. In the second bonding area BA2_3, the distance between the base circuit board 210 and the first substrate 110 may be defined as a second distance 123 that is greater than the first distance d1_3. In the display device 1_3 according to the present embodiment, however, since the adhesive layer 240_3 is not interposed in the second bonding area BA2_3, the second distance d2_3 may be smaller than the second distance d2 of the display device 1 according to one embodiment. Accordingly, a level difference between the first bonding area BA1_3 and the second bonding area BA2_3 can be reduced, and stress applied to the first circuit board 200 can also be reduced.

In the display device 1_3 according to the present embodiment, using the adhesive layer 240_3 disposed on a side surface of the first substrate 110 in the second direction Y can prevent permeation of moisture into the first bonding area BA1, and improve the adhesion between the first substrate 110 and the first circuit board 200. Further, since the adhesive layer 240_3 is attached to a side surface of the first substrate 110 in the second direction Y, the bezel of the display device can be decreased.

In addition, in the display device 1_3 according to the present embodiment, since the adhesive layer 240_3 is disposed on a side surface of the first substrate 110 in the second direction Y, it is possible to reduce a level difference of the first circuit board 200 between the first bonding area BA1_3 and the second bonding area BA2_3. Consequently, stress applied to the first circuit board 200 can be reduced.

In concluding the detailed description, those skilled in the art will appreciate that many variations and modifications can be made to the embodiments without substantially departing from the principles of the present inventive concepts. Therefore, the disclosed embodiments of the inventive concepts are used in a generic and descriptive sense only and not for purposes of limitation.

What is claimed is:

1. A display device comprising:
a display panel including a pad area including a plurality of pads; and
a first circuit board partially overlapping the pad area;
wherein the first circuit board includes:
  a first base board;
  a conductive layer disposed on the first base board and including a plurality of first bumps disposed on one end portion of the first base board, a plurality of second bumps disposed on an opposite end portion of the first base board, and a lead wiring connecting the plurality of first bumps to the plurality of second bumps;
  a passivation layer disposed on the first base board and covering the lead wiring; and
an adhesive layer disposed on the passivation layer and at least partially covering a top surface and a side surface of one end portion of the display panel,
wherein the display device further comprises:
a first bonding area where the pad and the first bump overlap each other in a thickness direction; and
a second bonding area where a top surface of the display panel and the adhesive layer overlap each other in the thickness direction,
wherein in the second bonding area,
the first base board has a first thickness,
the conductive layer has a second thickness,
the passivation layer has a third thickness, and
the adhesive layer has a fourth thickness,
wherein the third thickness is larger than the second thickness, the fourth thickness is larger than the third thickness, and the first thickness is larger than the fourth thickness.

2. The display device of claim 1, wherein the adhesive layer includes a first sub-adhesive portion in contact with the side surface of the display panel.

3. The display device of claim 2, wherein the adhesive layer further includes a second sub-adhesive portion extending from the first sub-adhesive portion and in contact with the top surface of the display panel.

4. The display device of claim 3, wherein the adhesive layer further includes a third sub-adhesive portion disposed between the first sub-adhesive portion and the second sub-adhesive portion, and wherein the third sub-adhesive portion is spaced apart from the side surface of the display panel.

5. The display device of claim 1, wherein the adhesive layer includes a thermosetting resin.

6. The display device of claim 1, further comprising a conductive film disposed in the pad area between the display panel and the first circuit board, wherein the conductive film includes at least one conductive ball.

7. The display device of claim 6, further comprising:
wherein a first distance is defined as a distance between the first base board and the display panel in the first bonding area, and
wherein a second distance is defined as a distance between the first base board and the display panel in the second bonding area, and wherein the second distance is greater than the first distance.

8. The display device of claim 6, wherein the conductive film and the adhesive layer partially overlap each other.

9. The display device of claim 8, wherein a density of the conductive balls is a first density in a region where the conductive film and adhesive partially overlap each other in the thickness direction, and a second density in a region where the conductive film does not overlap the adhesive layer in the thickness direction,
wherein the first density is greater than the second density.

10. The display device of claim 8, wherein the conductive film is disposed between the adhesive layer and the display panel in a region where the conductive film and adhesive layer partially overlap each other.

11. The display device of claim 1, wherein adhesion between the adhesive layer and the passivation layer is greater than adhesion between the adhesive layer and the display panel.

12. The display device of claim 1, wherein an area of the passivation layer overlapping the first base board is greater than an area of the adhesive layer overlapping the first base board.

13. The display device of claim 1, wherein the pad area and the adhesive layer extend in a first direction.

14. The display device of claim 13, wherein a length of the adhesive layer in the first direction is the same as a length of the first base board in the first direction.

* * * * *